(12) United States Patent
Murakami et al.

(10) Patent No.: US 8,043,697 B2
(45) Date of Patent: Oct. 25, 2011

(54) POLYIMIDE FILM-LAMINATED BODY

(75) Inventors: Masato Murakami, Ichihara (JP); Hiroaki Yamaguchi, Ichihara (JP)

(73) Assignee: Ube Industries, Ltd. (JP)

( * ) Notice: Subject to any disclaimer, the term of this patent is extended or adjusted under 35 U.S.C. 154(b) by 934 days.

(21) Appl. No.: 11/918,803

(22) PCT Filed: Apr. 17, 2006

(86) PCT No.: PCT/JP2006/308478
§ 371 (c)(1),
(2), (4) Date: Oct. 18, 2007

(87) PCT Pub. No.: WO2006/112523
PCT Pub. Date: Oct. 26, 2006

(65) Prior Publication Data
US 2009/0068454 A1      Mar. 12, 2009

(30) Foreign Application Priority Data

Apr. 19, 2005   (JP) .................. 2005-120541

(51) Int. Cl.
*B32B 15/08*   (2006.01)
(52) U.S. Cl. .................. 428/337; 428/457; 428/458
(58) Field of Classification Search .......... None
See application file for complete search history.

(56) References Cited

U.S. PATENT DOCUMENTS

| | | | |
|---|---|---|---|
| 5,868,949 A * | 2/1999 | Sotokawa et al. | 216/18 |
| 6,350,844 B1 * | 2/2002 | Ono et al. | 528/170 |
| 7,267,883 B2 * | 9/2007 | Fujihara et al. | 428/473.5 |
| 7,459,047 B2 * | 12/2008 | Usuki et al. | 156/87 |

FOREIGN PATENT DOCUMENTS

| | | | |
|---|---|---|---|
| CN | 1410471 A | | 4/2003 |
| CN | 1548474 A | | 11/2004 |
| JP | 57-181857 A | | 11/1982 |
| JP | 59-18221 A | | 1/1984 |
| JP | 61-111181 A | | 5/1986 |
| JP | 61-111359 A | | 5/1986 |
| JP | 62-212140 A | | 9/1987 |
| JP | 63-288744 A | | 11/1988 |
| JP | 1-52843 | | 11/1989 |
| JP | 3-85789 A | | 4/1991 |
| JP | 3-145185 A | | 6/1991 |
| JP | 7-307114 A | | 11/1995 |
| JP | 07307114 A | * | 11/1995 |
| JP | 8-134212 A | | 5/1996 |
| JP | 2003-71982 A | | 3/2003 |
| JP | 2004-230670 A | | 8/2004 |
| JP | 2004-358961 A | | 12/2004 |
| JP | 2005-19770 A | | 1/2005 |

* cited by examiner

*Primary Examiner* — Monique Jackson
(74) *Attorney, Agent, or Firm* — DLA Piper LLP (US)

(57) ABSTRACT

A polyimide film-laminated body is composed of a metal layer and an aromatic polyimide layer formed by casting a polyamic acid solution composition, comprising 3,3',4,4'-biphenyltetracarboxylic dianhydride as an essential tetracarboxylic dianhydride component and with introduction of a specific diamine component, onto a metal foil. The polyimide film-laminated body has an excellent gas permeation rate and moisture permeation rate, with heat resistance, a high elastic modulus and a low linear expansion coefficient, and with reduced foaming and delamination during the high-temperature steps for formation of the laminated body.

9 Claims, No Drawings

POLYIMIDE FILM-LAMINATED BODY

RELATED APPLICATION

This is a §371 of International Application No. PCT/JP2006/308478, with an international filing date of Apr. 17, 2006 (WO 2006/112523 A1, published Oct. 26, 2006), which is based on Japanese Patent Application No. 2005-120541, filed Apr. 19, 2005.

TECHNICAL FIELD

The present invention relates to a laminated body comprising a metal layer and an aromatic polyimide layer formed from an aromatic polyamic acid solution composition that is to be used as a dope solution for formation of an aromatic polyimide film layer, and the laminated body can be suitably used as a copper-clad wiring substrate for manufacture of a printed circuit board which is to be used in the electronic and electrical industries, or which can also be used as a different kind of electronic material such as a heater, radiator plate, thermal response element, hard disk suspension or the like, depending on the type of metal material. More specifically, the invention relates to a polyimide film-laminated body comprising a metal layer and an aromatic polyimide layer formed by casting a polyamic acid solution composition, wherein a tetracarboxylic dianhydride consisting of 3,3',4,4'-biphenyltetracarboxylic dianhydride as an essential component is the starting tetracarboxylic dianhydride component and a diamine consisting of an aromatic diamine with a specific structure as an essential component is the starting diamine component, into a film on a metal thin-film and evaporating off the solvent while imidizing the polyamic acid.

BACKGROUND ART

Polyimides derived from 3,3',4,4'-biphenyltetracarboxylic dianhydride, which produces heat resistant polyimides, are usually polyimides obtained using 3,3',4,4'-biphenyltetracarboxylic dianhydride and paraphenylenediamine as the starting acid dianhydride component and starting diamine component, respectively, and these are known to yield polyimides with low linear thermal expansion coefficients and high elastic moduli.

Because films composed of such polyimides have excellent thermal and electrical properties, they are widely used in electronic devices. However, it is not possible to achieve high adhesive strength with adhesives that are usually used in the field of electronics, while laminated bodies comprising metal layers formed by metal vapor deposition or sputtering have relatively low peel strength.

The polyimide films also have low saturated absorption percentages and low hygroscopic expansion coefficients, and therefore provide an advantage of dimensional stability against environmental changes. Yet their relatively low moisture permeation rates tend to result in foaming or delamination at the metal-polyimide interfaces of laminated bodies manufactured by casting methods.

Conventional polyimide laminated bodies made of aromatic polyimide film layers and metal material layers, and processes for their manufacture, are described or suggested in Japanese Examined Patent Publication No. 59-18221, Japanese Unexamined Patent Publication No. 57-181857, Japanese Unexamined Patent Publication No. 62-212140 and Japanese Examined Patent Publication No. 1-52843.

There has also been proposed a polyimide composite sheet comprising a metal film layer and an aromatic polyimide film layer formed by casting an aromatic polyamic acid solution composition, obtained by polymerizing an aromatic tetracarboxylic acid component composed of a biphenyltetracarboxylic anhydride and a pyromellitic anhydride, and an aromatic diamine component composed of a phenylenediamine and a diaminodiphenyl ether, onto a metal thin-film and drying the film while accomplishing imidization at high temperature (see Japanese Unexamined Patent Publication No. 61-111359).

There has also been proposed a printed wiring substrate comprising a metal film layer and an aromatic polyimide film layer formed by casting an aromatic polyamic acid solution composition, obtained by polymerizing an aromatic tetracarboxylic acid component composed of a biphenyltetracarboxylic anhydride and a pyromellitic anhydride, and an aromatic diamine component composed of a phenylenediamine and a diaminodiphenyl ether, onto an alkali-etchable metal substrate, performing imidization and then etching the metal substrate (see Japanese Unexamined Patent Publication No. 3-85789).

In addition, a flexible printed wiring substrate has been proposed which comprises a metal film layer and a polyimide film layer formed by casting a polyamic acid solution composition obtained by polymerizing components containing an aliphatic tetracarboxylic anhydride and a diamine onto a metal substrate and imidizing it (see Japanese Unexamined Patent Publication No. 2004-358961), but excessive time is required for drying and imidization, and this results in poor productivity.

DISCLOSURE OF THE INVENTION

We provide a polyimide film-laminated body which has reduced foaming and delamination during the high-temperature steps for production of the polyimide film-laminated body, due to an improved gas permeation rate and moisture permeation rate achieved by introduction of a diamine component with a specific structure, when using a 3,3',4,4'-biphenyltetracarboxylic dianhydride as the essential tetracarboxylic dianhydride component.

Specifically, the invention relates to a polyimide film-laminated body composed of a metal layer and an aromatic polyimide layer formed by casting a polyamic acid solution composition, wherein a tetracarboxylic dianhydride consisting of 3,3',4,4'-biphenyltetracarboxylic dianhydride as an essential component is the starting tetracarboxylic dianhydride component and a diamine consisting of at least 0.5 mol % and no greater than 30 mol % of a diamine represented by the general formula shown below is the starting diamine component, into a film on a metal foil and evaporating off the solvent while imidizing the polyamic acid.

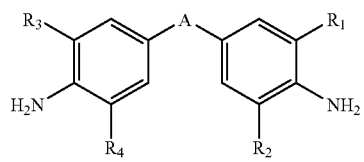

(wherein A is a direct bond or a crosslinking group and $R_1$-$R_4$ each represents one selected from among hydrogen, hydroxyl, carboxyl, C1-6 hydrocarbon groups, C1-6 alkoxy groups and carboalkoxy groups, with the proviso that at least one of $R_1$ and $R_2$ is not hydrogen, and at least one of $R_3$ and $R_4$ is not hydrogen.)

The invention further relates to a polyimide film-laminated body comprising a substrate laminated on the polyimide layer of a polyimide laminated body, either directly or via a heat resistant adhesive.

According to the invention it is possible to obtain a polyimide film-laminated body which has reduced foaming and delamination during the high-temperature steps for production of the polyimide film-laminated body, while maintaining the features of heat resistance, high elastic modulus and low linear expansion coefficient, due to an improved gas permeation rate and moisture permeation rate achieved by introduction of a diamine component with a specific structure, when using a 3,3',4,4'-biphenyltetracarboxylic dianhydride as the essential tetracarboxylic dianhydride component.

The laminated body of the invention has a novel polyimide layer which exhibits satisfactory adhesion and a satisfactory moisture permeation rate while maintaining the features of heat resistance, high elastic modulus and low linear expansion coefficient, and it is resistant to foaming or delamination at the adhesive interface during high-temperature treatment steps.

In addition, the polyimide film-laminated body of the invention can produce a compact with improved surface adhesion and an improved moisture permeation rate.

The laminated body of the invention has high adhesive strength between the polyimide film and substrate and a high moisture permeation rate through the polyimide layer, and is therefore resistant to foaming or delamination at the adhesive interface during high-temperature treatment steps.

BEST MODE FOR CARRYING OUT THE INVENTION

The following polyimide film-laminated bodies may be mentioned as preferred embodiments of the polyimide film-laminated body of the invention.

1) The polyimide film-laminated body described above wherein the remaining aromatic diamine is paraphenylenediamine.

2) The polyimide film-laminated body described above wherein the starting tetracarboxylic dianhydride component is 3,3',4,4'-biphenyltetracarboxylic dianhydride.

3) The polyimide film-laminated body described above wherein the elastic modulus of the polyimide layer after removal of the metal foil is at least 4 GPa and less than 9 GPa.

4) The polyimide film-laminated body described above wherein the polyamic acid solution composition contains a silane coupling agent comprising an alkoxysilane compound.

5) The polyimide film-laminated body described above wherein the metal foil is a copper foil.

6) The polyimide film-laminated body described above wherein the metal foil is a 1-10 μm thick copper foil with a releasable carrier layer.

The polyimide film-laminated body of the invention can be obtained by casting the aforementioned polyamic acid solution composition into a film on a metal foil, and evaporating off the solvent while imidizing the polyamic acid to form an aromatic polyimide layer.

The metal layer used for the invention may be a metal foil or metal plating layer of a simple metal or alloy such as copper, aluminum, gold, silver, nickel or stainless steel (preferably one suitable for most known techniques, such as a vapor deposition metal ground layer with a metal plating layer or chemical metal plating layer), but it is preferably a rolled copper foil or electrolytic copper foil. The thickness of the metal foil is not particularly restricted but is preferably 0.1 μm-10 mm and especially 1-18 μm. For further improved adhesive force onto such metal foils, the surface may be subjected to siding, nickel plating, copper-zinc alloy plating or chemical or mechanical surface treatment with an aluminum alcoholate, aluminum chelate, silane coupling agent, triazinethiol, benzotriazole, acetylene alcohol, acetylacetone, catechol, o-benzoquinone, tannin, quinolinol or the like.

When an ultrathin copper foil with a thickness of 1-10 μm is used as the metal layer, an easily manageable carrier-clad copper foil is preferably used. The carrier layer of the carrier-clad copper foil is not particularly restricted, but is preferably a rolled copper foil or electrolytic copper foil with a thickness of 5-150 μm. The carrier layer is preferably one that can be easily peeled from the ultrathin copper foil by mechanical force, and it preferably has a peel strength of 0.01-0.3 Kg/cm.

The polyamic acid solution composition used to obtain the polyimide film-laminated body of the invention may be produced by polymerizing, in an organic solvent, a tetracarboxylic dianhydride consisting of 3,3',4,4'-biphenyltetracarboxylic dianhydride as an essential component and a diamine component wherein at least 0.5 mol % and no greater than 30 mol %, preferably at least 1 mol % and no greater than 25 mol % and even more preferably at least 8 mol % and no greater than 20 mol % of the total diamine is an aromatic diamine represented by the general formula shown above.

Tetracarboxylic dianhydride components other than 3,3',4,4'-biphenyltetracarboxylic dianhydride may be used without any particular restrictions, although pyromellitic acid dianhydride may be mentioned as preferred, while diamine components other than the aromatic diamine represented by the general formula shown above among the diamines may also be used without any particular restrictions, although paraphenylenediamine may be mentioned as preferred. The proportion of 3,3',4,4'-biphenyltetracarboxylic dianhydride and pyromellitic acid dianhydride is preferably 7.5-100 mol % and especially 15-100 mol % of 3,3',4,4'-biphenyltetracarboxylic dianhydride and 0-92.5 mol % of pyromellitic acid dianhydride for the total aromatic tetracarboxylic dianhydrides, and it is especially preferred to use 3,3',4,4'-biphenyltetracarboxylic dianhydride alone.

The amount of polyamic acid is preferably about 1-20 mass % in the organic solvent solution of the polyamic acid.

According to the invention, an aromatic tetracarboxylic dianhydride containing 3,3',4,4'-biphenyltetracarboxylic dianhydride is preferably the starting acid dianhydride component while paraphenylenediamine and an aromatic diamine having the structure represented by the general formula shown above are preferably the starting diamine components in the proportion mentioned above, in order to obtain a polyimide film-laminated body which has reduced foaming and delamination, a high elastic modulus and moisture permeation rate, and improved adhesion.

A polyamic acid composition that yields a polyimide of the invention can be obtained by combining (a) a polyamic acid solution produced by polymerizing, in an organic solvent, an acid dianhydride including 3,3',4,4'-biphenyltetracarboxylic dianhydride and a diamine such as paraphenylenediamine other than an aromatic diamine represented by the general formula shown above (content of diamines such as paraphenylenediamine in 100 mol % of diamines in the polyamic acid: at least 70 mol % and no greater than 99.5 mol %, preferably at least 75 mol % and no greater than 99 mol %, and even more preferably at least 80 mol % and no greater than 92 mol %), and (b) a polyamic acid solution produced by polymerizing, in an organic solvent, an acid dianhydride including 3,3',4,4'-biphenyltetracarboxylic dianhydride and an aromatic diamine represented by the general formula shown above (content of aromatic diamine represented by the general formula in 100 mol % of diamines in the polyamic acid: at least 0.5 mol % and no greater than 30 mol %, preferably at least 1 mol % and no greater than 25 mol %, and even more preferably at least 8 mol % and no greater than 20 mol %).

A polyamic acid composition that yields a polyimide of the invention may also be obtained by producing (c) a polyamic acid solution obtained by copolymerizing, in an organic solvent, an acid dianhydride including 3,3',4,4'-biphenyltetracarboxylic dianhydride and an aromatic diamine represented by the general formula shown above and a diamine such as paraphenylenediamine other than an aromatic diamine represented by the general formula shown above (content of aromatic diamine represented by the general formula in 100 mol % of diamines in the polyamic acid: at least 0.5 mol % and no greater than 30 mol %, preferably at least 1 mol % and no greater than 25 mol %, and even more preferably at least 8 mol % and no greater than 20 mol %).

The (a) polyamic acid solution and (b) polyamic acid solution may be reacted with equimolar amounts of the carboxylic dianhydride component and diamine component, or either (a) or (b) may be in acid excess and the other in diamine excess.

The (c) polyamic acid may be reacted with equimolar amounts of the carboxylic dianhydride component and diamine component, or either component may be in excess.

In either case, cleavage and rebonding of polymer chains occurs during the process of imidization of the polyamic acid by heating, yielding a copolymerized polyimide either with block bonding or a random sequence. After heating has increased the viscosity in the step of heating and drying the cast polyamic acid solution, further heating causes the viscosity to be drastically reduced to a low viscosity, while even further heating produces a high viscosity product, eventually yielding a polyimide film made of a high-molecular-weight polyimide.

According to the invention, an additional diamine component and/or other acid component, such as 3,3',4,4'-benzophenonetetracarboxylic dianhydride, 2,2-bis(3,4-dicarboxyphenyl)propane, bis(3,4-dicarboxyphenyl)methane, bis(3,4-dicarboxyphenyl)ether or 2,3',3,4'-biphenyltetracarboxylic dianhydride, may in some cases be used in addition to each of the aforementioned components, in a range that does not adversely affect the elastic modulus and linear expansion.

As the crosslinking group A in the general formula for the aromatic diamine there may be mentioned oxygen atoms, sulfur atoms, methylene, carbonyl, sulfoxyl, sulfone, 1,1'-ethylidene, 1,2-ethylidene, 2,2'-isopropylidene, 2,2'-hexafluoroisopropylidene, cyclohexylidene, phenylene, 1,3-phenylenedimethylene, 1,4-phenylenedimethylene, 1,3-phenylenediethylidene, 1,4-phenylenediethylidene, 1,3-phenylenedipropylidene, 1,4-phenylenedipropylidene, 1,3-phenylenedioxy, 1,4-phenylenedioxy, biphenylenedioxy, methylenediphenoxy, ethylidenediphenoxy, propylidenediphenoxy, hexafluoropropylidenediphenoxy, oxydiphenoxy, thiodiphenoxy, sulfonediphenoxy and the like, or the A portion may be directly bonded without such a crosslinking group.

$R_1$-$R_4$ in the general formula for the aromatic diamine each represents a member selected from among hydrogen, C1-6 hydrocarbon groups, hydroxyl, carboxyl, C1-6 alkoxy and carboalkoxy. However, at least one of $R_1$ and $R_2$ is not hydrogen and at least one of $R_3$ and $R_4$ is not hydrogen.

As specific examples for $R_1$-$R_4$ in the general formula for the aromatic diamine there may be mentioned hydrogen, hydrocarbon groups such as methyl, ethyl, n-propyl, i-propyl, n-butyl, s-butyl, i-butyl, t-butyl, pentyl, cyclohexyl and phenyl, alkoxy groups such as hydroxyl, methoxy, ethoxy, propoxy and butoxy, carboxyl, and carboalkoxy groups such as carbomethoxy, carboethoxy, carbopropoxy and carbobutoxy. $R_1$-$R_4$ may all be the same, or they may all be different from each other.

As specific examples of aromatic diamines represented by the general formula shown above there may be mentioned 3,3'-dimethyl-4,4'-diaminobiphenyl, 3,3'-dihydroxy-4,4'-diaminobiphenyl, 3,3'-dicarboxy-4,4'-diaminobiphenyl, 3,3'-dimethoxy-4,4'-diaminobiphenyl, 3,3',5,5'-tetramethyl-4,4'-diaminobiphenyl, 4,4'-methylene-bis(2-methylaniline), 4,4'-methylene-bis(2-ethylaniline), 4,4'-methylene-bis(2-isopropylaniline), 4,4'-methylene-bis(2,6-dimethylaniline), 4,4'-methylenebis(2,6-diethylaniline), 4,4-methylene-bis(2,6-diisopropylaniline), 3,3'-dihydroxy-4,4'-diaminodiphenylmethane, 3,3'-dicarboxy-4,4'-diaminodiphenylmethane, 3,3'-dicarboxy-4,4'-diamino-5,5'-dimethyldiphenylmethane, o-tolidinesulfone and the like, among which 4,4'-methylene-bis(2,6-dimethylaniline) is preferred.

After combining both of the components of the polyamic acid solution, the amine terminals of the polyamic acid are sealed by addition of a dicarboxylic acid anhydride, for example, phthalic anhydride or its substituted form (for example, 3-methyl or 4-methylphthalic anhydride), hexahydrophthalic anhydride or its substituted form or succinic anhydride or its substituted form, and preferably phthalic anhydride.

In order to limit gelling of the film, a phosphorus-based stabilizer such as triphenyl phosphite or triphenyl phosphate may be added in a range of 0.01-1% with respect to the concentration of the solid (polymer) during polymerization of the polyamic acid. An imidizing agent may also be added to the doping solution to promote imidization. For example, an imidazole, 1-methylimidazole, 2-methylimidazole, 1,2-dimethylimidazole, 2-phenylimidazole, benzimidazole, isoquinoline substituted pyridine or the like may be used in a proportion of 0.05-10 mass % and more preferably 0.1-2 mass % with respect to the polyamic acid. These will allow imidization to be completed at a relatively low temperature.

There are no particular restrictions on the method of forming the polyimide layer during production of the polyimide film-laminated body, but it is advantageous for the metal foil to be coated with the polyamic acid solution, dried and heat treated for imidization. The imidization reaction is carried out by coating the polyamic acid solution, drying it and then performing heat treatment at 200° C. or higher, preferably 300° C. or higher and even more preferably 300-600° C.

Any desired method may be employed for the imidization reaction, but a common method involves stationing the layer containing the pre-dried, uncured polyamic acid solution for a fixed period in a hot air drying furnace with adjustable temperature, or continuously moving it through a drying furnace area zone and establishing a constant prescribed drying and curing time for high temperature heat treatment (200° C. or above) Considering efficiency and yield of the operation, the pre-dried uncured polyamic acid solution that has been coated may be wound into a roll and heated at high temperature in a batch treatment system. When using a batch treatment system, the high temperature (200° C. or above) heat treatment is preferably carried out under reduced pressure in a reducing gas atmosphere in order to prevent oxidation of the conductors. In the dry curing step, the polyamic acid solution is evenly coated onto the metal foil and then subjected to heat treatment to remove the solvent and achieve imide cyclization. Rapid heat treatment at high temperature produces a skin layer on the resin surface that may hamper evaporation of the solvent or cause foaming, and therefore it is preferred for the heat treatment to be carried out while gradually raising the temperature from a low temperature to a high temperature.

Normally, the polyamic acid solution is coated onto a metal foil, preferably a roughened metal foil, and the solvent is dried, after which further heat treatment is performed at high temperature to promote imidization reaction; however, the imidization reaction can be accelerated by adding an amine such as pyridine or quinoline, or acetic anhydride.

In order to inhibit warping of the laminated body of the invention, a polyimide-based resin layer with relatively high thermal expansion may be provided in contact with the metal foil, between the metal foil and the polyimide film layer of the invention.

As organic solvents to be used for production of the polyamic acid there may be mentioned N-methyl-2-pyrrolidone, N,N-dimethylformamide, N,N-dimethylacetamide, N,N-diethylacetamide, dimethylsulfoxide, hexamethylphosphoramide, N-methylcaprolactam and the like. These organic solvents may be used alone or in combinations of two or more.

Each of the components may be used for copolymerization of diamine components and tetracarboxylic dianhydrides that yield the polyamic acids of (a) and (b) in organic solvents at a temperature of 0-100° C. and preferably 5-50° C., to form polyamic acid solutions (which may be partially imidized so long as a homogeneous solution state is maintained), and the polyamic acid solutions may be combined and the resulting polyamic acid solution, with the acid components and diamine components of the finally obtained polyamic acids in roughly equimolar amounts and the components in proportions within the ranges specified above, cast as a film onto a metal thin-film and dried, imidized and heated dried (cured) to produce a polyimide film-laminated body of the invention. The maximum heat treatment temperature for heat drying is preferably in the range of 350-600° C.

The diamine and tetracarboxylic dianhydride components that yield the polyamic acid (c) may each be polymerized in an organic solvent at a temperature of 0-100° C. and preferably 5-50° C. to form a polyamic acid solution (which may be partially imidized so long as a homogeneous solution state is maintained), the polyamic acid solutions may be combined, and the resulting polyamic acid solution, with the acid components and diamine components of the finally obtained polyamic acids in roughly equimolar amounts and the components in proportions within the ranges specified above, cast as a film onto a metal thin-film and dried, imidized and heated dried (cured) to produce a polyimide film-laminated body of the invention. The maximum heat treatment temperature for heat drying is preferably in the range of 350-600° C.

According to the invention it is possible to obtain a polyimide film-laminated body with improved adhesion and an improved moisture permeation rate, which is also resistant to foaming and delamination at the adhesion interface during the high-temperature treatment step.

The polyimide film-laminated body preferably has a polyimide layer that, after removal of the metal layer, exhibits a high elastic modulus and low linear expansion coefficient, and specifically an elastic modulus of at least 4 GPa and less than 9 GPa and especially at least 5 GPa and no greater than 8.5 GPa, a breaking strength of at least 200 MPa and especially at least 200 MPa and no greater than 500 MPa, and a linear expansion coefficient (100-250° C.) of $1 \times 10^{-5}$ to $3 \times 10^{-5}$ cm/cm/° C. and especially $1 \times 10^{-5}$ to $2.5 \times 10^{-5}$ cm/cm/° C.

When etching is performed for working of the polyimide film-laminated body of the invention, the etching solution used is preferably an aqueous alkali solution, and preferably an alkali metal aqueous solution or a mixture containing it. Potassium hydroxide is preferred as an alkali because it allows etching to proceed most efficiently, but sodium hydroxide or lithium hydroxide may be used instead, and hydroxides of alkaline earth metals may also be used; however, potassium, sodium or their mixtures are preferred from the standpoint of etching properties. In order to increase affinity of the polyimide in the alkali metal aqueous solution, it is advantageous to add an alcoholic or organic solvent, for example, an oxyalkylamine comprising a primary amine such as ethanolamine, propanolamine or butanolamine, a secondary amine such as diethanolamine or dipropanolamine, or hydrazine monohydrate, ethylenediamine, dimethylamine, dimethylformamide, cresol, ethylene glycol or the like. There is no limit to the aforementioned organic solvents so long as the solvent has high affinity with the polyimide resin.

For an alkali metal hydroxide, the concentration of the aqueous alkali solution is preferably 30-70 mass % alkali metal hydroxide with respect to the total of water and the alkali metal hydroxide, while the etching temperature range is preferably higher for a faster etching rate, and is preferably 50° C. or higher.

For a polyimide film-laminated body of the invention, another base such as a metal foil may be laminated on the polyimide layer of the polyimide film, either directly or via an adhesive.

According to the invention, a silane coupling agent such as 3-aminopropyltrimethoxysilane, N-phenyl-3-aminopropyltrimethoxysilane, 3-mercaptopropyltrimethoxysilane, 3-glycidylpropyltrimethoxysilane, 3-isocyanatopropyltrimethoxysilane or 3-aminopropyltriethoxysilane may be added in an amount of 0.01-10 mass % and more preferably 0.1-5 mass % with respect to the solid content (polymer) during polymerization of the polyamic acid, for the purpose of improving the adhesive strength and mechanical strength of the polyimide film.

The laminated body of the invention may be obtained by laminating a base, and preferably a metal layer such as a copper layer, onto the surface layer of the polyimide of the invention in the polyimide film-laminated body, either directly or via an adhesive. The metal layer may be formed by lamination of the metal foil using a lamination method, or using a thin-film forming method and an electroplating method. The lamination method for a copper layer, when a metal thin-film and copper plating layer are formed using a thin-film forming method and electroplating, may be any publicly known method.

In the lamination method, a heat resistant adhesive layer may be formed on the polyimide layer and a metal foil stacked over it as a base, and heating and pressurization performed to obtain a laminated body. The heat resistant adhesive is not particularly restricted so long as it is a heat resistant adhesive used in the field of electronics, and as examples there may be mentioned polyimide-based adhesives, epoxy-modified polyimide-based adhesives, phenol resin-modified epoxy resin adhesives, epoxy-modified acrylic resin-based adhesives and epoxy-modified polyamide-based adhesives. The heat resistant adhesive layer may be formed by any desired method that is employed in the field of electronics, and for example, the adhesive solution may be coated and dried on the polyimide layer and base, or a separately formed adhesive film may be attached thereto.

The metal layer used as the base may be a metal foil or metal plating layer of a simple metal or alloy such as copper, aluminum, gold, silver, nickel or stainless steel (preferably one suitable for most known techniques, such as a vapor deposition metal ground layer with a metal plating layer or chemical metal plating layer), but it is preferably a copper foil such as a rolled copper foil or electrolytic copper foil. The thickness of the metal foil used as the base is not particularly restricted but is preferably 0.1 μm-10 mm and especially 1-18 μm.

When an ultrathin copper foil with a thickness of 1-10 μm is used as the metal layer, an easily manageable carrier-clad copper foil is preferably used. The carrier layer of the carrier-clad copper foil is not particularly restricted, but is preferably a rolled copper foil or electrolytic copper foil with a thickness of 5-150 μm. The carrier layer is preferably one that can be easily peeled from the ultrafilm copper foil by mechanical force, and it preferably has a peel strength of 0.01-0.3 Kg/cm.

According to a preferred embodiment of the invention, the laminated body has a novel polyimide layer that maintains the features of heat resistance, high elastic modulus and low linear expansion coefficient while exhibiting satisfactory adhesion and a satisfactory moisture permeation rate, and is resistant to foaming and delamination at the adhesion interface during the high-temperature treatment step.

A compact comprising a different substrate such as a ceramic, glass panel, silicon wafer, or a metal or polyimide film of the same or different type, may be attached to the laminated body of the invention using a heat resistant adhesive.

The laminated body of the invention can be suitably used as a board for electronic parts. For example, it may be suitably used as a printed circuit board, power circuit board, flexible heater, resistor board, radiator plate, thermal response element, hard disk suspension or the like.

The invention will now be explained in greater detail by examples and comparative examples.

The properties described below were evaluated in the following manner.

Elastic Modulus and Breaking Strength

A test sample punched into the shape of a 4 mm-wide dumbbell was measured using a TENSILON UTM-II-20 by Orientech Co., Ltd. according to ASTM D882, under conditions with a chuck distance of 30 mm and a pull rate of 2 mm/min.

Peel Strength (180° Peel Strength)

A TENSILON UTM-II-20 by Orientech Co., Ltd. was used for measurement of the 180° peel strength according to JIS C6471 under conditions with a pull rate of 40 mm/min.

Linear Expansion Coefficient

A TMA50 by Shimadzu Corp. was used to measure the linear expansion coefficient at 100-250° C., with an initial load of 5 g and a heating rate of 5° C./min.

Foaming and Delamination of Laminated Body

The condition of foaming or delamination was judged by visual examination.

STARTING DOPE SYNTHESIS EXAMPLE 1

After adding N,N-dimethylacetamide (DMAc) into a reactor and stirring, paraphenylenediamine (PPD) was added under a nitrogen stream the temperature was kept at 50° C. until complete dissolution. Next, 3,3',4,4'-biphenyltetracarboxylic dianhydride (BPDA), in an amount such that the diamine component and dicarboxylic acid component were in equimolar amounts, was slowly added to the solution while controlling heat release, and upon completion of the addition, reaction was continued for 3 hours while keeping a temperature of 50° C. to obtain a polyamic acid solution with a monomer concentration of 18 mass % (viscous yellow liquid, 25° C. solution viscosity=approximately 1000 poise). This solution will be referred to as "solution 1".

STARTING DOPE SYNTHESIS EXAMPLE 2

Reaction was conducted in the same manner as Synthesis Example 1, except that 3,3'-dicarboxy-4,4'-diaminodiphenylmethane (MBAA) was added instead of PPD, to obtain a polyamic acid solution with a monomer concentration of 18 mass % (viscous tan liquid, 25° C. solution viscosity=approximately 500 poise). This solution will be referred to as "solution 2".

STARTING DOPE SYNTHESIS EXAMPLE 3

Reaction was conducted in the same manner as Synthesis Example 1, except that 4,4'-methylene-bis(2,6-dimethylaniline) (MDX) was added instead of PPD, to obtain a polyamic acid solution with a monomer concentration of 18 mass % (viscous tan liquid, 25° C. solution viscosity=approximately 1000 poise). This solution will be referred to as solution 3.

STARTING DOPE SYNTHESIS EXAMPLE 4

Reaction was conducted in the same manner as Synthesis Example 1, except that 4,4'-methylene-bis(2-methylaniline) (MDT) was added instead of PPD, to obtain a polyamic acid solution with a monomer concentration of 18 mass % (viscous dark red liquid, 25° C. solution viscosity=approximately 1000 poise). This solution will be referred to as solution 4.

STARTING DOPE SYNTHESIS EXAMPLE 5

Reaction was conducted in the same manner as Synthesis Example 1, except that 3,3'-dimethoxy-4,4'-diaminobiphenyl (DANS) was added instead of PPD, to obtain a polyamic acid solution with a monomer concentration of 18 mass % (viscous light blackish brown liquid, 25° C. solution viscosity=approximately 1500 poise). This solution will be referred to as solution 5.

STARTING DOPE SYNTHESIS EXAMPLE 6

Reaction was conducted in the same manner as Synthesis Example 1 except that 3,3'-dimethyl-4,4'-diaminobiphenyl (TB) was added instead of PPD, to obtain a polyamic acid solution with a monomer concentration of 18 mass % (viscous tan liquid, 25° C. solution viscosity=approximately 800 poise). This solution will be referred to as solution 6.

STARTING DOPE SYNTHESIS EXAMPLE 7

Reaction was conducted in the same manner as Synthesis Example 1, except that pyromellitic acid dianhydride (PMDA) was added instead of BPDA and 4,4'-diaminodiphenyl ether (ODA) was added instead of PPD, to obtain a polyamic acid solution with a monomer concentration of 18 mass % (viscous pale yellow liquid, 25° C. solution viscosity=approximately 600 poise). This solution will be referred to as solution 7.

EXAMPLES 1-5

Solution 1 and solutions 2-6 were combined in a proportion such that the molar ratio of PPD as the diamine in the first solution and the diamine in the second solution was 90:10, and 1,2-dimethylimidazole was added to 2 mass % with respect to the polyamic acid. The resulting solution was coated onto the rough surface of a copper foil (SLP by Nippon Denkai, Ltd., 18 μm thickness) to a final film thickness of about 25 μm and heated at 135° C. for 3 minutes to form a solid film, after which it was anchored to a stainless steel frame and heated at 130° C. for 3 minutes and at 180° C. for 1 minute, raised in temperature to 450° C. over a period of 5 minutes and held at 450° C. for 2 minutes for heat treatment to obtain a polyimide copper foil laminated body. No foaming or delamination was observed in the obtained laminated body.

The 180° peel strength at the interface of the laminated body was measured to evaluate the adhesive strength. The copper foil of the laminated body was then removed by etching with a 40% ferric chloride aqueous solution and the elastic modulus and breaking strength of the obtained polyimide film were measured.

The results are shown in Table 1.

COMPARATIVE EXAMPLE 1

A polyimide copper foil laminated body was obtained in the same manner as Example 1, except that only solution 1 was used. Extensive foaming and delamination were observed, and a uniform laminated body could not be obtained.

The 180° peel strength was measured at a portion of the bonding interface of the laminated body, for evaluation of the adhesive strength. The copper foil of the laminated body was then etched with a 40% ferric chloride aqueous solution and the elastic modulus, breaking strength and breaking elongation of the obtained polyimide film were measured.

The results are shown in Table 1.

COMPARATIVE EXAMPLE 2

A polyimide copper foil laminated body was obtained in the same manner as Example 1, except that solution 1 and solution 7 were combined in a proportion such that the molar ratio of the diamine in the first solution and the diamine in the second solution was 50:50. Partial foaming and delamination were observed, and a uniform laminated body could not be obtained.

The 180° peel strength was measured at a portion of the bonding interface of the laminated body, for evaluation of the adhesive strength. The copper foil of the laminated body was then etched with a 40% ferric chloride aqueous solution and the elastic modulus and breaking strength of the obtained polyimide film were measured.

The results are shown in Table 1.

TABLE 1

| Example | Diamine content of polyimide layer (mol %) | Breaking strength (MPa) | Tensile modulus (GPa) | 180° Peel strength (kg/cm) | Foaming/ delamination |
|---|---|---|---|---|---|
| Example 1 | Solution 2 10% | 350 | 7.2 | 1.1 | none |
| Example 2 | Solution 3 10% | 390 | 7.4 | 1.1 | none |
| Example 3 | Solution 4 10% | 310 | 6.9 | 1.0 | none |
| Example 4 | Solution 5 10% | 330 | 6.8 | 0.7 | none |
| Example 5 | Solution 6 10% | 290 | 7.1 | 0.9 | none |
| Comparative Example 1 | Solution 1 100% | 510 | 8.8 | 0.4 | extensive |
| Comparative Example 2 | Solution 7 50% | 240 | 3.6 | 0.4 | partial |

EXAMPLES 6-9

A polyimide copper foil laminated body was obtained in the same manner as Example 1, except that solution 1 and solution 3 were combined so that the diamine content in solution 3 was as listed in Table 2, 1,2-dimethylimidazole was further added at 2 mass % with respect to the polyamic acid, and the resulting solution was coated onto the rough surface of a copper foil (SLP by Nippon Denkai, Ltd., 18 μm thickness) to a final film thickness of 25 μm. No foaming or delamination was observed in the obtained laminated body.

The 180° peel strength at the interface of the laminated body was measured to evaluate the adhesive strength. The copper foil of the laminated body was then etched with a 40% ferric chloride aqueous solution and the elastic modulus and breaking strength of the obtained polyimide film were measured.

The results are shown in Table 2.

COMPARATIVE EXAMPLE 3

A polyimide copper foil laminated body was obtained in the same manner as Example 6, except that solution 1 and solution 3 were combined so that the diamine content in solution 3 was as listed in Table 2.

The results are shown in Table 2.

EXAMPLE 10

A polyimide copper foil laminated body was obtained in the same manner as Example 2, except that coating was to a final film thickness of 15 μm. No foaming or delamination was observed in the obtained laminated body.

The results are shown in Table 2.

TABLE 2

| Example | Diamine content of polyimide layer (mol %) | Polyimide layer thickness (μ) | Breaking strength (MPa) | Tensile modulus (GPa) | 180° Peel strength (kg/cm) | Foaming/ delamination |
|---|---|---|---|---|---|---|
| Example 6 | Solution 3 5% | 25 | 430 | 7.9 | 0.6 | none |
| Example 7 | Solution 3 15% | 25 | 370 | 7.4 | 1.15 | none |
| Example 8 | Solution 3 20% | 25 | 340 | 7.2 | 1.2 | none |
| Example 9 | Solution 3 30% | 25 | 330 | 6.8 | 1.2 | none |
| Example 10 | Solution 3 10% | 15 | 410 | 7.8 | 1.1 | none |
| Comparative Example 3 | Solution 3 50% | 25 | 113 | 4.4 | | none |

EXAMPLE 11

A polyimide copper foil laminated body was obtained in the same manner as Example 2, except that USLPR2 (Nippon Denkai, Ltd., thickness: 9 μm) was used as the copper foil. No foaming or delamination was observed in the obtained laminated body.

The results are shown in Table 3.

EXAMPLE 12

A polyimide copper foil laminated body was obtained in the same manner as Example 2, except that 3EC-VLP (Mitsui Mining & Smelting Co., Ltd., thickness: 9 μm) was used as the copper foil. No foaming or delamination was observed in the obtained laminated body.

The results are shown in Table 3.

EXAMPLE 13

A polyimide copper foil laminated body was obtained in the same manner as Example 2, except that USLPR2 (Nippon Denkai, Ltd., thickness: 12 μm) was used as the copper foil. No foaming or delamination was observed in the obtained laminated body.

The results are shown in Table 3.

EXAMPLE 14

A polyimide copper foil laminated body was obtained in the same manner as Example 2, except that HLA2 (Nippon Denkai, Ltd., thickness: 12 μm) was used as the copper foil. No foaming or delamination was observed in the obtained laminated body.

The results are shown in Table 3.

EXAMPLE 15

A polyimide copper foil laminated body was obtained in the same manner as Example 2, except that F2WS (Furukawa Circuit Foil Co., Ltd., thickness: 12 μm) was used as the copper foil. No foaming or delamination was observed in the obtained laminated body.

The results are shown in Table 3.

TABLE 3

| Example | Polyimide layer thickness (μ) | Copper foil thickness (μ) | Breaking strength (MPa) | Tensile modulus (GPa) | 180° Peel strength (kg/cm) | Foaming/delamination |
|---|---|---|---|---|---|---|
| Example 11 | 25 | USL-PR-2 9 | 392 | 7.5 | 0.62 | none |
| Example 12 | 25 | 3EC-VLP 9 | 360 | 6.8 | 0.25 | none |
| Example 13 | 25 | USL-PR-2 12 | 420 | 7.6 | 0.55 | none |
| Example 14 | 25 | HLA2 12 | 400 | 7.2 | 0.15 | none |
| Example 15 | 25 | F2WS 12 | 390 | 6.3 | 0.55 | none |

EXAMPLE 16

A polyimide copper foil laminated body was obtained in the same manner as Example 2, except that YSNAP-1B (Nippon Denkai, Ltd., carrier layer thickness: 18 μm, copper foil thickness: 1 μm) was used as the copper foil. The carrier layer was peeled off to obtain a laminated body with a 1 μm metal layer and a 25 μm polyimide layer. No foaming or delamination was observed in the laminated body.

EXAMPLE 17

A polyimide copper foil laminated body was obtained in the same manner as Example 2, except that YSNAP-3B (Nippon Denkai, Ltd., carrier layer thickness: 18 μm, copper foil thickness: 3 μm) was used as the copper foil. The carrier layer was peeled off to obtain a laminated body with a 3 μm metal layer and a 25 μm polyimide layer. No foaming or delamination was observed in the laminated body.

EXAMPLE 18

A polyimide copper foil laminated body was obtained in the same manner as Example 2, except that XTF-1 (Olin Brass Japan, Inc., carrier layer thickness: 35 μm, copper foil thickness: 1 μm) was used as the copper foil. The carrier layer was peeled off to obtain a laminated body with a 1 μm metal layer and a 25 μm polyimide layer. No foaming or delamination was observed in the laminated body.

EXAMPLE 19

A polyimide copper foil laminated body was obtained in the same manner as Example 2, except that XTF-3 (Olin Brass Japan, Inc., carrier layer thickness: 35 μm, copper foil thickness: 3 μm) was used as the copper foil. The carrier layer was peeled off to obtain a laminated body with a 3 μm metal layer and a 25 μm polyimide layer. No foaming or delamination was observed in the laminated body.

EXAMPLE 20

Solution 1 and solution 3 were combined in a proportion such that the molar ratio of the diamine (PPD) in solution 1 and the diamine (MDX) in solution 3 was 90:10, and then 1,2-dimethylimidazole was added at 2 mass % with respect to the polyamic acid while N-phenyl-3-aminopropyltrimethoxysilane was added at 1 mass % with respect to the polyamic acid. The solution was coated onto the rough surface of a copper foil (SLP by Nippon Denkai, Ltd., 18 μm thickness) to a final film thickness of 25 μm to obtain a polyimide copper foil laminated body in the same manner as Example 1. No foaming or delamination was observed in the obtained laminated body.

The 180° peel strength at the interface of the laminated body was measured to evaluate the adhesive strength. The copper foil of the laminated body was then etched with a 40% ferric chloride aqueous solution and the elastic modulus and breaking strength of the obtained polyimide film were measured.

The results are shown in Table 4.

EXAMPLE 21

A polyimide copper foil laminated body was obtained in the same manner as Example 20, except that N-phenyl-3-aminopropyltrimethoxysilane was added at 3 mass % with respect to the polyamic acid. No foaming or delamination was observed in the obtained laminated body.

The results are shown in Table 4.

EXAMPLE 22

A polyimide copper foil laminated body was obtained in the same manner as Example 20, except that N-phenyl-3- aminopropyltrimethoxysilane was added at 5 mass % with respect to the polyamic acid. No foaming or delamination was observed in the obtained laminated body.

The results are shown in Table 4.

EXAMPLE 23

Solution 1 and solution 3 were combined in a proportion such that the molar ratio of the diamine (PPD) in solution 1 and the diamine (MDX) in solution 3 was 90:10, and then 3-mercaptopropyltrimethoxysilane was added at 1 mass % with respect to the polyamic acid while 1,2-dimethylimidazole was added at 2 mass % with respect to the polyamic acid. The solution was coated onto the rough surface of a copper foil (SLP by Nippon Denkai, Ltd., 18 μm thickness) to a final film thickness of 25 μm to obtain a polyimide copper foil laminated body in the same manner as Example 1. No foaming or delamination was observed in the obtained laminated body.

The 180° peel strength at the interface of the laminated body was measured to evaluate the adhesive strength. The copper foil of the laminated body was then etched with a 40% ferric chloride aqueous solution and the elastic modulus and breaking strength of the obtained polyimide film were measured.

The results are shown in Table 4.

EXAMPLE 24

A polyimide copper foil laminated body was obtained in the same manner as Example 23, except that 3-mercaptopropyltrimethoxysilane was added at 3 mass % with respect to the polyamic acid. No foaming or delamination was observed in the obtained laminated body.

The results are shown in Table 4.

EXAMPLE 25

A polyimide copper foil laminated body was obtained in the same manner as Example 23, except that 3-mercaptopropyltrimethoxysilane was added at 5 mass % with respect to the polyamic acid. No foaming or delamination was observed in the obtained laminated body.

The results are shown in Table 4.

TABLE 4

| Example | Silane coupling agent (mass %) | Breaking strength (MPa) | Tensile modulus (GPa) | 180° Peel strength (kg/cm) | Foaming/ delamination |
| --- | --- | --- | --- | --- | --- |
| Example 20 | Si-1 1 | 390 | 7.3 | 1.1 | none |
| Example 21 | Si-1 3 | 370 | 7.5 | 1.1 | none |
| Example 22 | Si-1 5 | 340 | 7.4 | 1.05 | none |
| Example 23 | Si-2 1 | 400 | 7.2 | 1.3 | none |
| Example 24 | Si-2 3 | 430 | 7.3 | 1.4 | none |
| Example 25 | Si-2 5 | 370 | 7.4 | 1.2 | none |

Si-1: N-Phenyl-3-aminopropyltrimethoxysilane
Si-2: 3-Mercaptopropyltrimethoxysilane The laminated sheets obtained in Examples 1-25 and Comparative Examples 1 and 2 were examined for the presence of foaming or delamination at the bonding interfaces during the high-temperature treatment step, according to the following evaluation method.

Evaluation method: The obtained laminated body was immersed in purified water at 23° C. for 24 hours, and after wiping off the adhering water, it was immersed for 10 seconds in a soldering bath at 280° C. The results are shown below.

Sheets with foaming/delamination: Comparative Example 1, Comparative Example 2.

Sheets with no foaming: Examples 1-10, Examples 12-25.

INDUSTRIAL APPLICABILITY

The present invention provides a polyimide film-laminated body with an excellent gas permeation rate and moisture permeation rate, with heat resistance, a high elastic modulus and a low linear expansion coefficient, and with reduced foaming and delamination during the high-temperature steps for formation of laminated bodies, and it is therefore an industrially useful invention.

The invention claimed is:

1. A polyimide film-laminated body composed of a metal layer and an aromatic polyimide layer formed by casting, a polyamic acid solution composition, wherein a tetracarboxylic dianhydride consisting of 3,3',4,4'-bipbenyltetracarboxylic dianhydride as an essential component is a starting tetracarboxylic dianhydride component and a diamine consisting of at least 0.5 mol % and no greater than 30 mol % of 4,4'-methylene-bis(2,6-dimethylaniline) is a starting diamine component, into a film on a metal foil and evaporating off a solvent while imidizing the polyamic acid.

2. The polyimide film-laminated body according to claim 1, wherein a remaining diamine is paraphenylenediarnine.

3. The polyimide film-laminated body according to claim 1, wherein the starting tetracarboxylic dianhydride component is 3,3',4,4'-biphenyltetracarboxylic dianhydride.

4. The polyimide film-laminated body according to claim 1, wherein an elastic modulus of the aromatic polyimide film after removal of the metal foil is at least 4 GPa and less than 9 GPa.

5. The polyimide film-laminated body according, to claim 1, wherein the polyamic acid solution composition contains a silane coupling agent comprising an aikoxysilane compound.

6. The polyimide film-laminated body according to claim 1, wherein the metal foil is a copper foil, 7. The polyimide film-laminated body according to claim 6, wherein the metal foil is a 1-10μm thick copper foil with a releasable carrier layer.

8. A polyimide film-laminated body with a 1-10μm thick copper layer obtained by releasing the carrier layer from the laminated body according to claim 7.

9. A polyimide film-laminated body obtained by laminating a substrate onto the polyimide layer of the polyimide laminated body according to claim 1, either directly or via a heat resistant adhesive.

* * * * *